United States Patent [19]

Johnson et al.

[11] Patent Number: 4,937,465
[45] Date of Patent: Jun. 26, 1990

[54] SEMICONDUCTOR FUSE BLOWING AND VERIFYING METHOD AND APPARATUS

[75] Inventors: Gary M. Johnson; Jon P. Busack, both of Boise, Id.

[73] Assignee: Micron Technology, Inc., Boise, Id.

[21] Appl. No.: 281,109

[22] Filed: Dec. 8, 1988

[51] Int. Cl.$^5$ .................... H03K 17/00; H03K 19/003
[52] U.S. Cl. ................................ 307/202.1; 307/441; 307/219
[58] Field of Search ...................... 307/202.1, 219, 441, 307/465; 365/51, 225.7

[56] References Cited

U.S. PATENT DOCUMENTS

| | | | |
|---|---|---|---|
| 3,666,967 | 5/1972 | Keister et al. | 307/202.1 |
| 3,882,324 | 5/1975 | Smolker et al. | 307/202.1 |
| 4,446,534 | 5/1984 | Smith | 307/202.1 |
| 4,621,201 | 11/1986 | Amdahl et al. | 307/219 |
| 4,714,839 | 12/1987 | Chung | 307/219 |
| 4,791,319 | 12/1988 | Tagami et al. | 307/202.1 |

Primary Examiner—John Zazworsky
Attorney, Agent, or Firm—Jon Paul Busack; Stan Protigal; Angus C. Fox

[57] ABSTRACT

One or more selected fuses among a plurality of fuses are blown by using electronic means to discharge a capacitor and route the resulting current spike to the selected fuse. Also, a driver output current is approximated by measuring suply currents for an unloaded output and for a loaded output and comparing the two supply currents. If the driver output is connected to the active end of a fuse, the supply current demanded by the driver indicates a state of the fuse. The invention finds particular utility when used on an integrated circuit memory array with fuse activated redundancy.

5 Claims, 4 Drawing Sheets

SEMICONDUCTOR FUSE BLOWING AND VERIFYING METHOD AND APPARATUS

FIELD OF THE INVENTION

This invention relates to automated test equipment and methods for semiconductor devices, specifically in the area of device repair or programming.

BACKGROUND OF THE INVENTION

As semiconductor memory devices become more dense, the probability of producing a faulty memory device increases. One chance in a million of producing a faulty memory element is much more risky for 4-Megabit memory device production than it is for 16-kilobit production. One approach to improving memory manufacturing yields is the use of redundant (spare) elements in the memory array. If a memory location is faulty, it can be replaced by redundant memory, thereby making the chip functional.

To replace a memory location, addressing circuits are enabled and disabled by blowing one or more fuses located in the chip. Blowing a combination of fuses replaces a specific memory location.

Memory redundancy fusing ability is not standard in many memory testers, so inexpensive apparatus to assist a tester in this endeavor would be advantageous. Another advantage would be gained if the apparatus allowed a tester to determine the state (blown or intact) of any given fuse of the device under test, for verification or diagnosis. Yet another advantage would be gained if the apparatus was addressable, allowing the tester to blow one or more of a plurality of fuses.

SUMMARY OF THE INVENTION

The addressable fuse blowing and verifying apparatus described herein interfaces a memory tester or clocking device to a semiconductor device's fuses, to allow the tester to blow a combination of on-chip fuses and to subsequently verify the blow.

The fuse blowing methodology is an application of I=Cdv/dt: a suddenly discharged capacitor produces a current spike. Although this technique has been applied to such things as firing automotive spark plugs, the invention discharges a capacitor through a fuse, the resulting current spike blowing the fuse.

With a moderate initial voltage and a discharge capacitor of sufficient size, a current spike can be generated that is strong enough to blow a small fuse, such as might be found on a semiconductor device.

The novel apparatus blows one or more of a plurality of fuses in a semiconductor chip. A clocking device, called a tester, presents address, control, and voltage signals to the apparatus, which successively charges the capacitor and discharges same through the selected fuses A fuse can also be verified through the apparatus by isolating the capacitor, selecting a fuse, forcing a voltage to the fuse, and measuring current demand of the fuse. A first current level indicates an intact fuse, and a second current level indicates a blown fuse.

With a driver provided to force a voltage onto a fuse's active node, the fuse verifying method comprises forcing a voltage by the driver to the fuse node, measuring the current required by the driver, the driver current being approximately equal to the current required by the fuse.

Although the preferred embodiment of this invention specifically relates to implementation of redundant addresses to repair a semiconductor memory device, the invention could be applied to other fuse or fuse-type uses (that is, programmable by a current spike or voltage pulse) such as ROM and PAL programming, etc.

DETAILED DESCRIPTION OF THE PREFERRED EMBODIMENTS

Figure 1:
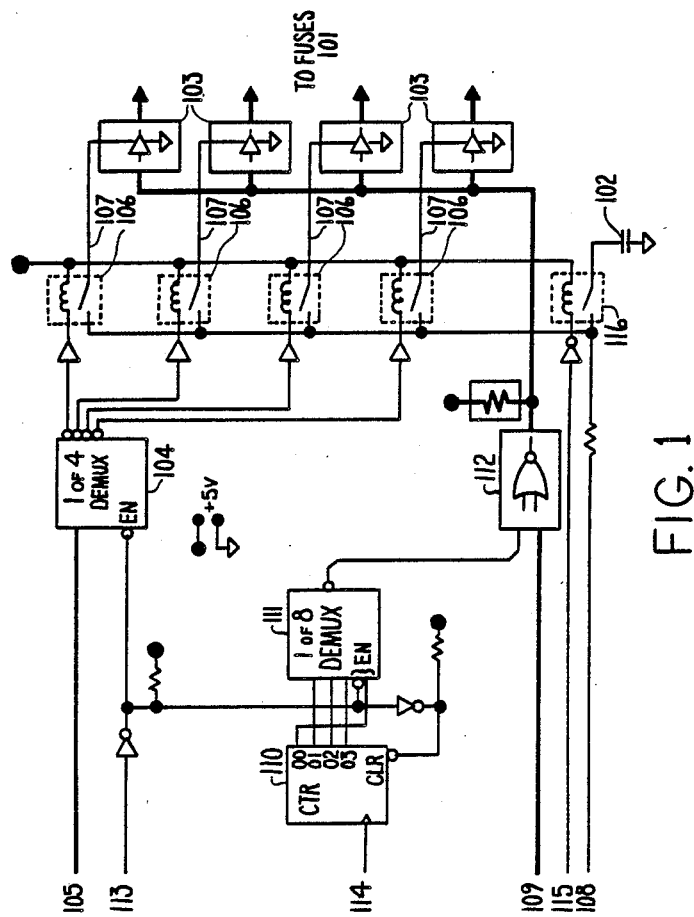
FIG. 1 is a schematic of the preferred embodiment.
Figure 2:
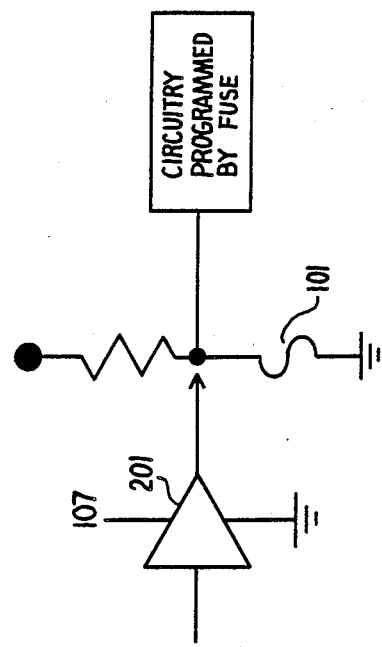
FIG. 2 details a single driver and fuse configuration.

A preferred embodiment allows a tester to blow and verify one or more of twenty eight fuses 101 located on a semiconductor memory chip. As shown in FIGS. 1 and 2, the embodiment primarily consists of a discharge capacitor 102, four banks 103 of seven drivers 201 each, and controlling means to discharge the capacitor 102 through one selected driver 201 at a time (to blow a fuse), or to power one bank 103 at a time while a driver 201 in the bank 103 is activated (to verify a fuse).

One of banks 103 is selected by an output of demultiplexer 104, which receives an address from address lines 105. Demultiplexer 104 closes a particular one of relays 106 which allows the selected bank of banks 103 to be powerable by a corresponding one of power lines 107, which is driven by bus 108. One or more drivers 201 within the selected bank 103 can be selected by placing zeros on corresponding address lines 109. A counter 110 outputs to a demultiplexer 111 which outputs (active low) to a bank 112 of two-input NOR gates, activating only one of the selected drivers 201 at a time. Each NOR gate in the bank 112 has an address line 109 on one input and a corresponding demultiplexer 111 line on the other input.

Control 113 enables the demultiplexers 104 and 111 and clears the counter 110. Control 114 clocks the counter 110. Control 115 switches the capacitor 102 to the bus 108 via a relay 116, said bus 108 being powerable by a supply, illustrated in FIG. 4.

In a blow process, the effect of the apparatus is to blow, one at a time, each fuse 101 indicated by zeros on address lines 109, within the bank 103 selected by address lines 105. The least significant output of the counter 110 drives an enable input of the demultiplexer 111 so that as the counter 110 increments, the demultiplexer 111 is disabled every other control 114 cycle, thus allowing the capacitor 102 charging time between driver 201 activations.

Figure 4:
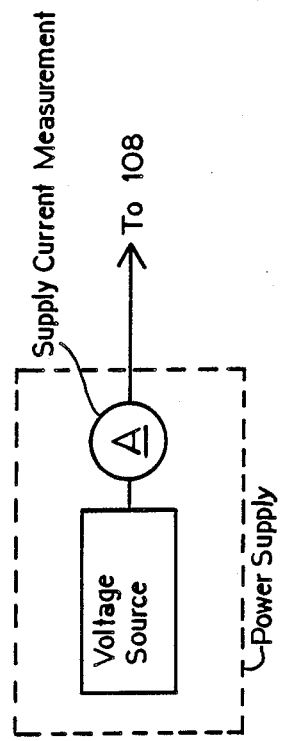
FIG. 4 illustrates a power supply having current measuring means, used in the preferred embodiment.

In a verify process, the effect of the apparatus is to connect one fuse 101 indicated by address lines 109, via the driver bank 103 power input 107 selected by address lines 105, to the bus 108, so that output current of the driver 201 in the selected bank 103 can be approximated by measuring supply current of said bank 103, preferably using current measurement means included in the voltage supplies of many memory testers, an example being shown as element A in FIG. 4. As deducible from FIG. 2, a driver 201 driving an intact fuse 101 will require relatively large supply current. A driver 201 driving a blown fuse 101 will require relatively small supply current. Hence, when only one driver 201 in a bank 103 is activated, supply current of the bank 103 directly indicates the current demand, and therefore the state, of the fuse 101.

OPERATION

There are at least two uses of this apparatus: blow and verify. Blowing is the process of selecting a fuse or fuses and clocking the invention to blow each selected fuse. Verifying is the connection from the tester through the apparatus to a selected fuse, and subsequent parametric measurement to determine the state of the fuse.

Figure 3:
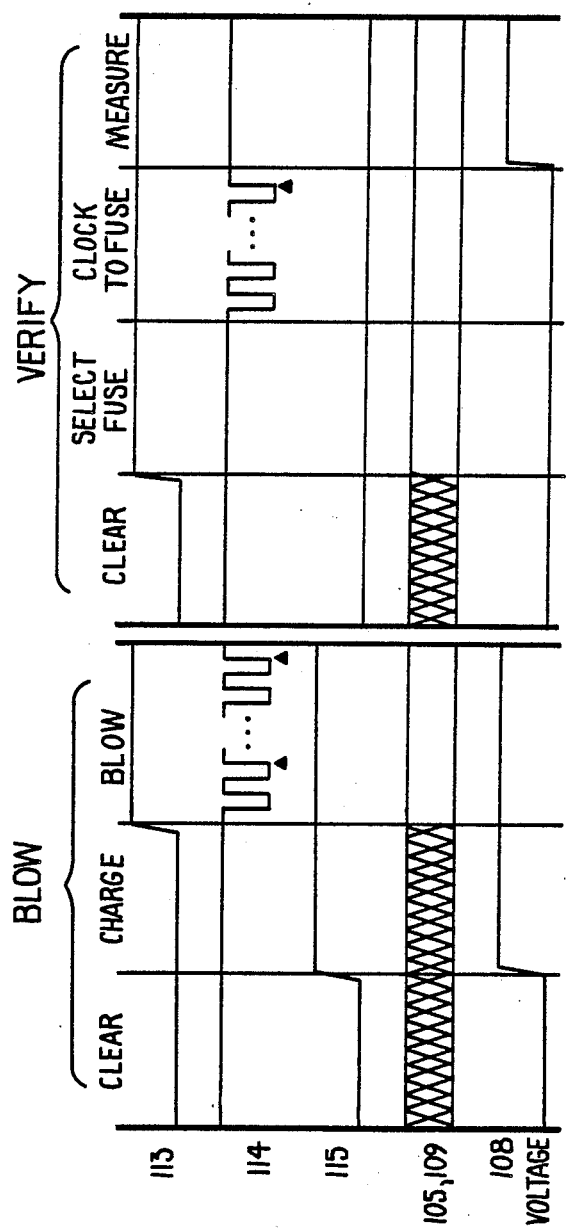
FIG. 3a is a timing diagram depicting a blow process of the preferred embodiment.
FIG. 3b is a timing diagram depicting a verify process of the preferred embodiment.

Blowing a fuse or fuses consists of three steps: clear, charge, and blow, as shown in FIG. 3a.

The apparatus is cleared by putting controls 113 and 115 low and control 114 high. Control 113 low clears the counter 110 and disables demultiplexers 104 and 111, disabling the driver banks 103 by isolating them from the bus 108. Control 114 high prevents the counter 110 from incrementing. Control 115 low isolates the discharge capacitor 102.

The capacitor 102 is then charged by putting controls 114 and 115 high, control 113 low, and putting a charging voltage on the bus 108. Control 115 low isolates the capacitor 102. Control 114 high prevents the counter 110 from incrementing. Control 115 high connects the capacitor 102 to the bus 108.

To then blow fuse or fuses 101, controls 113 and 115 are set high, the bus 108 continues to carry the charging voltage, an address is placed on address lines 105 and 109, and control 114 is clocked enough times to select each driver 201 in the selected bank 103 at least once. Address lines 105 select one of the banks 103. A zero on one or more of address lines 109 will cause the corresponding fuses 101 to be blown.

Verifying a fuse has four steps: clear, select fuse, clock to fuse, and measure, as shown in FIG. 3b.

The apparatus is cleared by putting controls 113 and 115 low and control 114 high. Control 113 low clears the counter 110 and disables the demultiplexers 104 and 111, disabling driver banks 103 by isolating them from power 108. Control 114 high prevents the counter 110 from incrementing. Control 115 low isolates the discharge capacitor 102.

The fuse 101 is selected by putting controls 113 and 114 high, control 115 low, a low voltage on the bus 108, and addresses on lines 105 and 109. Control 113 high enables the demultiplexers 104 and 111 and counter 110. Control 114 high prevents the counter 110 from incrementing. Control 115 low isolates the discharge capacitor 102. The address lines 105 select a driver bank 103, and a zero on one of the address lines 109 selects a driver 201 within the selected bank 103.

With control 113 high, control 115 low, and the address forced on lines 105 and 109, the driver 201 of the fuse 101 of interest is then activated by clocking control 114 a specific number of times.

With controls 113 and 114 high, control 115 low, and addresses forced on lines 105 and 109, a parametric test is performed by forcing a voltage and measuring a current through bus 108. As already described, the current so measured will indicate the selected fuse 101 status.

Although these are the elements and steps of choice, many modifications of the preferred embodiment could be made without stepping outside the claims. The steps for blowing and verifying may be reordered to some extent. Logic polarities may be changed. XNORs might be used instead of NORs. Assorted resistors, pullups, pulldowns, buffers, and inverters may be added or removed. The circuit might be expanded to access less or more fuses than twenty eight. Switching devices other than relays might be used.

We claim:

1. Apparatus to urge a current spike into a fuse which is included in a semiconductor device, comprising:
   (a) a capacitor;
   (b) charging means for said capacitor;
   (c) a driver having an output and a power input, the fuse being responsive to said output;
   (d) means to select said driver;
   (e) means to suddenly discharge said capacitor, after charging by said charging means, into said power input and consequently out said output and into the fuse, so that the fuse is blown without damage to the semiconductor device.

2. The apparatus of claim 1, wherein said fuse blowing alters a permanent operating characteristic of said semiconductor device, thereby effecting a repair in the semiconductor device.

3. The apparatus of claim 2, further comprising:
   (a) means to force a voltage to the selected driver's power input; and
   (b) means to measure current drawn by the input, the current indicating a state of the fuse.

4. Apparatus to urge a current spike into a fuse which is included in a semiconductor device, comprising:
   (a) a capacitor;
   (b) charging means for said capacitor;
   (c) means to select the fuse; and
   (d) means to suddenly discharge said capacitor, after charging by said charging means, into the selected fuse so that the fuse is blown without damage to the semiconductor device;
   WHEREIN a permanent operating characteristic of the semiconductor device is altered by the selected fuse when blown, thereby effecting a repair in the semiconductor device.

5. The apparatus of claim 4, further comprising:
   (a) means to force a voltage to the selected fuse; and
   (b) means to measure current drawn by the selected fuse, the current indicating a state of the selected fuse.

* * * * *